United States Patent [19]
Asami

[11] Patent Number: 4,750,027
[45] Date of Patent: Jun. 7, 1988

[54] MASTER SLICE SEMICONDUCTOR DEVICE
[75] Inventor: Fumitaka Asami, Tokyo, Japan
[73] Assignee: Fujitsu Limited, Kanagawa, Japan
[21] Appl. No.: 913,583
[22] Filed: Sep. 30, 1986

Related U.S. Application Data
[63] Continuation of Ser. No. 542,615, Oct. 17, 1983, abandoned.

[30] Foreign Application Priority Data
Oct. 15, 1982 [JP] Japan .................. 57-179955

[51] Int. Cl.⁴ .................. H01L 27/10; H01L 27/02
[52] U.S. Cl. .................. 357/45; 357/51; 357/42; 357/40
[58] Field of Search .................. 357/40, 42, 45, 51

[56] References Cited
U.S. PATENT DOCUMENTS
3,312,871  4/1967  Seki et al. .................. 357/45
4,161,662  7/1979  Malcolm et al. .................. 357/45
4,636,831  1/1987  One et al. .................. 357/51

OTHER PUBLICATIONS
IEEE Transactions on Consumer Electronics, vol. Aug. 1980, pp. 201-210.

Primary Examiner—Martin H. Edlow
Assistant Examiner—Robert P. Limanek
Attorney, Agent, or Firm—Armstrong, Nikaido, Marmelstein & Kubovcik

[57] ABSTRACT

A master slice semiconductor device comprising a plurality of basic cell arrays and a plurality of flip-flop cell arrays. The basic cell and flip-flop cell arrays are interconnected by strip-like diffused resistor regions with metal conductors via contact windows formed in an insulation layer on a bulk. The basic cell arrays, the flip-flop cell arrays, and the diffused resistor regions are buried in the bulk in advance. The diffused resistor regions are located in empty regions where lands, composing the basic cell and flip-flop cell arrays, are not formed in the bulk.

10 Claims, 10 Drawing Sheets

MASTER SLICE SEMICONDUCTOR DEVICE

This application is a continuation of application Ser. No. 542,615 filed 10/17/83 now abandoned.

BACKGROUND OF THE INVENTION

1. Field of the Invention

The present invention relates to a semiconductor device, more particularly to a master slice semiconductor device.

2. Description of the Prior Art

Increasing use has been made of master slice semiconductor devices in recent years so as to improve customer service. In a master slice semiconductor device (hereinafter referred to as "master slice IC"), many basic circuit elements are formed in advance, and are thereafter suitably connected by conductors to form a variety of IC products. In other words, a variety of circuit functions needed by individual users can be obtained from the same bulk circuit elements by suitably arranging conductors.

The most popular type of master slice IC uses polysilicon gates. This type of master slice IC is composed of metal oxide semiconductor (MOS) transistors fabricated by polysilicon as their gate electrodes and is advantageous for miniaturizing IC patterns and, therefore, realizing a high density.

While polysilicon gate type master slice IC's are the most popular, at present, another type of master slice IC, which uses metal gates, is still in strong demand, for example, in the field of small scale integration (SSI) devices or middle scale integration (MSI) devices. This type of IC offers some advantages over a polysilicon gate type, such as a higher withstand voltage and lower manufacturing cost.

The high withstand voltage is due to the usual 10 $\mu$m width, i.e., channel length, of a metal gate, as compared with the usual 1 $\mu$m width of a polysilicon gate.

The low manufacturing cost is due to the lower number of masks used for manufacturing a metal gate IC than for a polysilicon gate IC.

Metal gate IC's, however, are not suited for highly dense IC's or simple pattern designs due to the wide width of the metal gates and to the need for complicated arrangement of the power lines and signal lines on the IC substrate.

The metal gates could be made narrower. While this would cause at most no technical trouble, it would entail a costly overhaul of existing metal gate IC manufacturing lines.

As for the complicated arrangement of lines, this is an inherent disadvantage of metal gate IC's. Polysilicon gates can freely intersect with power lines, signal lines, and other metal conductors since each polysilicon gate is usually covered by an insulation film and, thus, no short circuits are expected to occur. Metal gates, however, must be kept from intersecting with metal conductors, since the metal is not covered by an insulation film.

In such a case, so-called diffused resistor regions are very useful so as to form multilevel crossings where such intersections are inevitable. In a master slice IC, however, not all the diffused resistor regions will finally be used, thus resulting in needless space occupied by unused regions. This space must be compensated for to obtain high IC integration.

SUMMARY OF THE INVENTION

It is an object of the present invention to provide a master slice IC with a large space margin which can compensate for areas occupied by unused diffused resistor regions.

Another object is to provide special patterns of diffused resistor regions free from unused diffused resistor regions due to the large space margin.

The above objects are attained by fabricating flip-flop (FF) circuits, indispensable to a variety of IC's, not with the basic cells as usual, but with particular cells prepared for constructing the FF circuits only, thereby producing a space margin for accommodating some of the preformed diffused resistor regions which are left unused depending upon the type of final IC.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Figure 1:
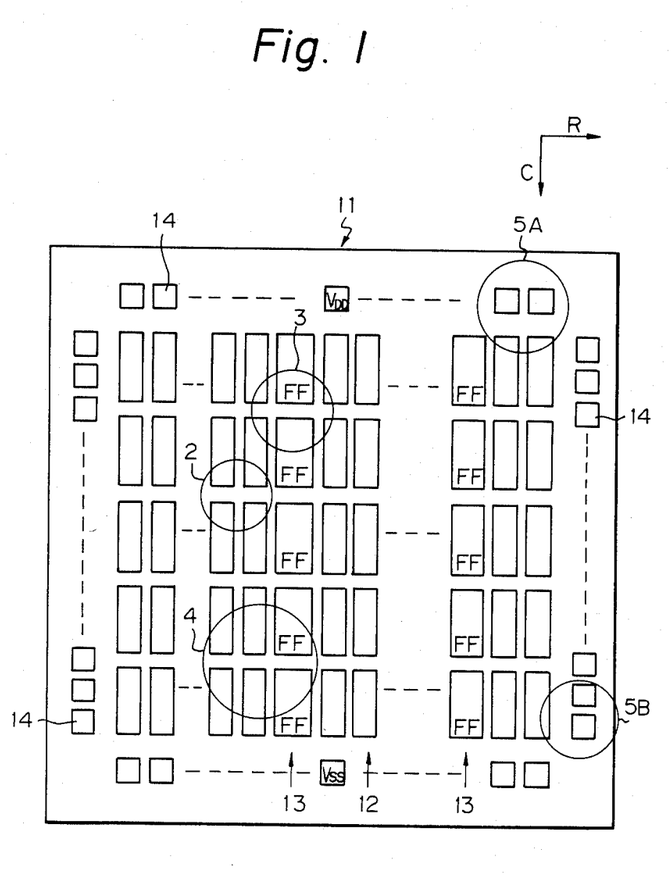
FIG. 1 is a plan view of a master slice semiconductor device according to the present invention.

FIG. 1 is a plan view of a master slice semiconductor device according to the present invention. That is, FIG. 1 shows the general layout of one chip of the device. Reference numeral 11 represents a bulk provided as a base of the one-chip device. The center part of the bulk 11 holds many cell arrays.

An arrow R indicates a row (horizontal) direction, and an arrow C indicates a column (vertical) direction (same for later figures). The cell arrays extend in the column direction at a predetermined pitch in the row direction.

Most of the cell arrays are basic cell arrays 12, shown by columns of narrow blocks. Each of the basic cells in the arrays is fabricated by two pairs of P-channel MOS transistor and an N-channel MOS transistor. Unlike the usual commercialized master slice IC, however, the master slice IC of the present invention also includes FF cell arrays 13, shown by columns of wide blocks. The ratio of FF cell arrays 13 to basic cell arrays 12, may be suitably determined according to the circuit function needed.

Each basic cell array 12 is formed of a plurality of lands, shown by individual blocks in FIG. 1, each land comprising a plurality of basic cells. The space between adjacent lands is empty.

Similarly, each FF cell array 13 is formed of a plurality of lands, each land comprising one or more FF circuits. The space between these adjacent lands is also empty.

Such empty regions are also provided between adjacent basic cell arrays and between adjacent basic cell and FF cell arrays.

In the empty regions, many strip-like diffused resistor regions (not shown in FIG. 1) are formed regularly, mainly in the row direction R. On the bulk 11, input-/ouput (I/O) cells 14 are located along its periphery, as usual. Strip-like diffused resistor regions are regularly formed between each adjacent I/O cell 14 and the cell arrays (12, 13).

The above constitutes the basic part of the present invention. That is, the FF cell arrays 13, are buried in advance in the bulk 11. The diffused resistor regions are also buried in advance therein. The diffused resistor regions may be used to construct multilevel crossings with the metal conductors in a later process.

As is well known, FF circuits are usually indispensable members in fabricating IC's. To be specific, FF circuits are essential in fabricating, for example, a counter, an UP/DOWN counter, a shift register, a Johnson counter, and a universal shift register. In usual master slice IC's, such circuit elements have been fabricated by using only the basic cells. Therefore, the degree of IC integration has been limited to some extent, since an FF circuit created from basic cells requires too much chip area.

Since, in the present invention, the FF circuits are formed in advance in the form of the FF cell arrays 13, the areas occupied by FF circuits made of the FF cells are necessarily about half that as usual. This compensates for the loss in area caused by the unused diffused resistor regions. The FF circuits are preferably constructed as so-called D flip-flops having set and reset function terminals in order to sufficiently satisfy user needs.

Figure 2:
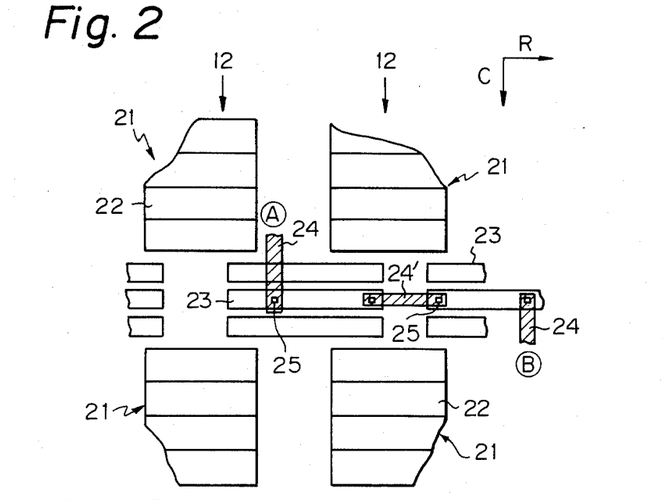
FIG. 2 is an enlarged plan view of a portion of FIG. 1.

FIG. 2 is an enlarged plan view of the portion enclosed by a circle 2 in FIG. 1. As previously mentioned, each basic cell array and each FF cell array are segmented into a plurality of lands. The empty regions between adjacent lands include diffused resistor regions, generally referred to as first diffused resistor regions. The first diffused resistor regions are here classified into second and third diffused resistor regions. The second diffused resistor regions are illustrated in FIG. 2. In this figure, each arrow 12 indicates a basic cell array. Four lands 21 are partially illustrated therein. Reference numeral 22 represents a basic cell itself. Each of the second diffused resistor regions is referenced by a numeral 23. Each group of diffused resistor regions 23, for example, three, arranged parallelly in the column direction is located between two adjacent basic cell lands 21 arranged in the row direction. Metal conductors are also illustrated, as wired with the regions 23, for example, from a point (A) to a point (B), referenced as numeral 24 with hatchings. Reference numeral 24' represents a particular metal conductor to be wired between two adjacent diffused resistor regions only, referred to as a lead conductor hereinafter. These metal and lead conductors 24, 24' are connected to diffused resistor regions 23 via contact windows 25 formed in an insulation layer located on the surface of the bulk.

Figure 3:
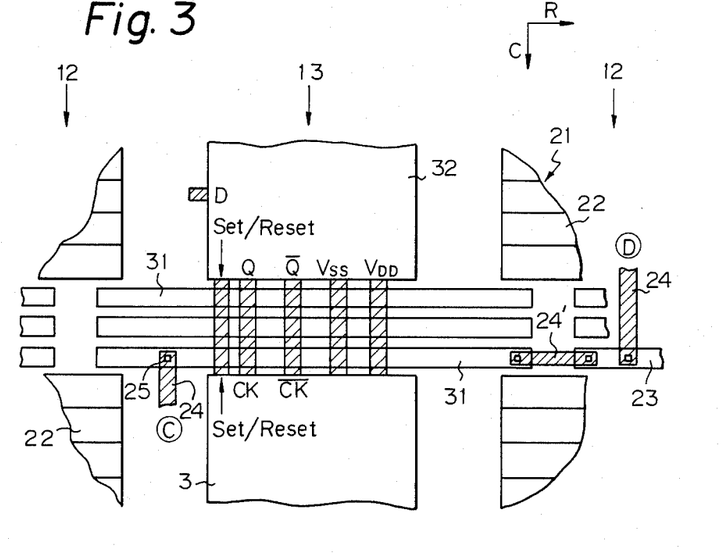
FIG. 3 is an enlarged plan view of another portion of FIG. 1.

FIG. 3 is an enlarged plan view of the portion enclosed by a circle 3 in FIG. 1. FIG. 3 mainly illustrates the third diffused resistor regions 31 located between adjacent lands 32 for composing the FF cells. The regions 31, for example three, extend in the row direction and are arranged parallelly in the column direction. The metal and lead conductors 24, 24' are also illustrated, which are wired with the regions 31, 23, for example, from a point (C) to a point (D).

As diagrammed in FIG. 3, the diffused resistor regions 31 are oriented in the row direction and also extend between two basic cell lands 21 located at both sides of the corresponding FF cell land 32. This arrangement is employed due to a fact that two or more FF cell lands 32 are frequently connected in cascade in the column direction with the metal conductors.

Figure 4:
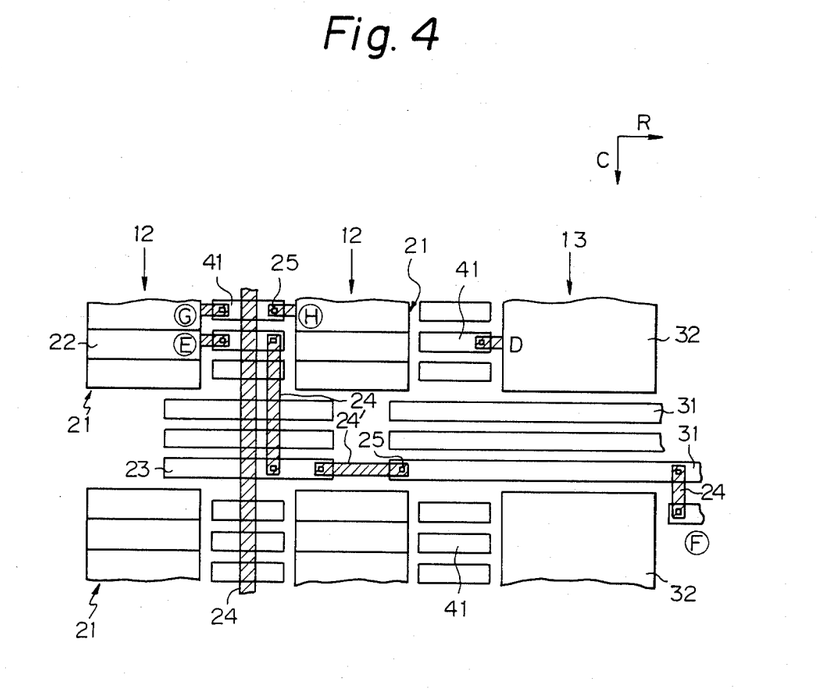
FIG. 4 is an enlarged plan view of still another portion of FIG. 1.

FIG. 4 is an enlarged plan view of the portion enclosed by a circle 4 in FIG. 1. FIG. 4 mainly illustrates fourth diffused resistor regions, as referenced by numeral 41. The metal and lead conductors 24, 24' are also illustrated, which are wired with the regions 23, 31, 41, for example, from a point (E) to a point (F).

As diagrammed in FIG. 4, the fourth diffused resistor regions 41 are oriented in the row direction and also arranged parallelly with each other in the column direction, between adjacent basic cell lands 21 in the basic cell arrays 12 and also between each FF cell land 32 in the FF cell array 13 and the basic cell land 21 adjacent thereto. When one land is to be connected with another adjacent land, but, the metal conductor 24 is arranged to intersect therebetween, it may be convenient to utilize the fourth diffused resistor region 41 to construct the multilevel crossing with the concerned conductor 24, as exemplified by a connection between a point (G) and a point (H). Thus, the fourth diffused resistor regions 41 is used for connecting one side of each land (21, 32) with the other side of another land adjacent thereto in the row direction.

Input/output (I/O) ports of each land will be described below. It should be recognized first that the I/O port of each basic cell land 21 is preferably concentrated mainly along the sides extending in parallel with the column direction. This is because each I/O port can be led to the corresponding fourth diffused resistor region 41 with the shortest route therebetween. Conversely, the I/O terminals of each FF cell land 32 are preferably concentrated mainly along the sides extending in parallel with the row direction R. This is because the I/O terminals thereof, such as Q, $\overline{Q}$, CK, $\overline{CK}$, Set, and Reset shown in FIG. 3 are usually connected in cascade when producing, for example, a counter.

Figure 5A:
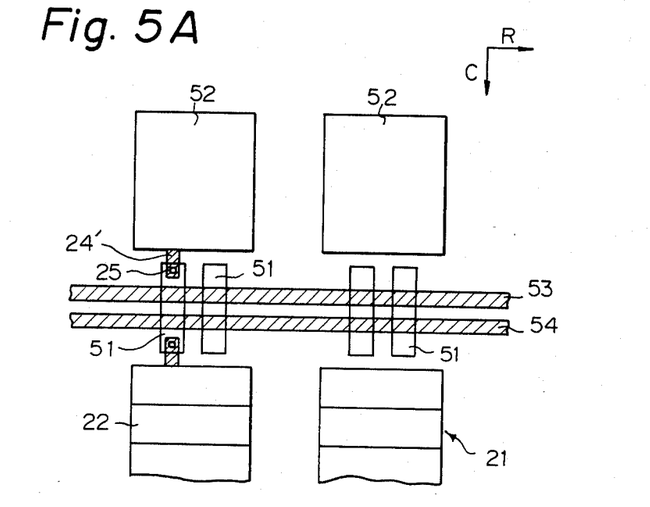
FIG. 5A is an enlarged plan view of still another portion of FIG. 1.
Figure 5B:
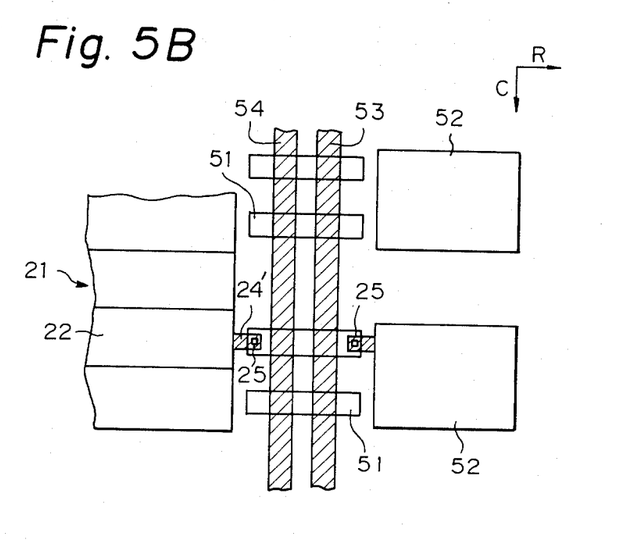
FIG. 5B is an enlarged plan view of still another portion of FIG. 1.

FIG. 5A is an enlarged plan view of the portion enclosed by a circle 5A in FIG. 1, and FIG. 5B is an enlarged plan view of the portion enclosed by a circle 5B in FIG. 1. FIGS. 5A and 5B mainly illustrate fifth diffused resistor regions, as referenced by numeral 51.

Empty regions are formed between a center part, including the basic cell and FF cell lands therein, of the chip and a peripheral part, including I/O cells 52 therein (identical to the members 14 in FIG. 1), of the same chip. In the thus formed empty regions, at least power line conductors 53, as $V_{DD}$ lines, and/or power line conductors 54, as $V_{SS}$ lines, are located with the highest priority. These power line conductors are respectively connected to the $V_{DD}$ pad and $V_{SS}$ pad, both shown in FIG. 1. The parallel fifth diffused resistor regions 51 are oriented perpendicular to the direction in which the power line conductors extend. Therefore, the I/O cells 52 can easily be connected to the cell arrays 12 and 13. Similarly, in FIG. 5B, the parallel fifth diffused resistor regions 51 are oriented perpendicular to the direction in which the power line conductors 53, 54 extend. Thus, the multilevel crossings can easily be constructed between the fifth diffused resistor regions 51 and the power line conductors 53 and 54. In these figures, the lead conductors 24', the contact windows 25, and so on have already been explained. It should be recognized that the I/O ports of the basic cell lands 21, adjacent to the I/O cells 52, are preferably concentrated along the sides extending in parallel to the row direction, which is perpendicular to the direction in which the I/O ports of the lands, located not adjacent to these I/O cells 52 are concentrated.

Figure 6A:
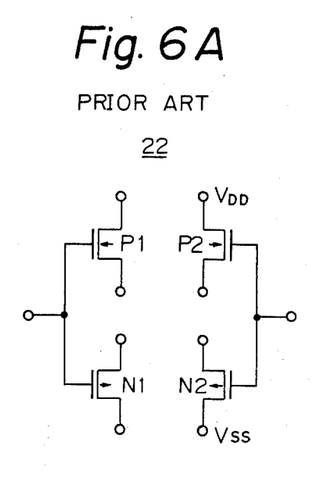
FIG. 6A is a circuit diagram of an example of a basic cell.
Figure 6B:
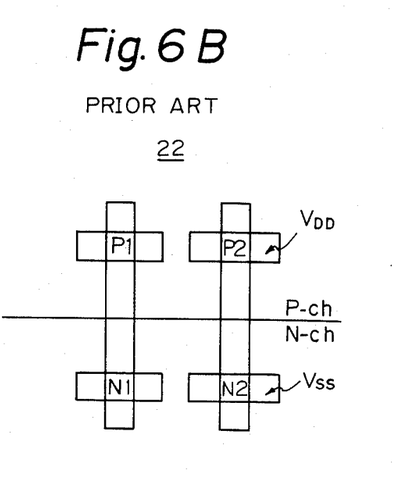
FIG. 6B shows an example of the actual layout pattern of the basic cell in FIG. 6A.

FIG. 6A is a circuit diagram of an example of a basic cell, and FIG. 6B shows an example of an actual layout pattern of the basic cell shown in FIG. 6A. In FIGS. 6A and 6B, reference symbols $P_1$ and $P_2$ represent first and second P-channel MOS transistors respectively, $N_1$ and $N_2$ first and second N-channel MOS transistors, P-ch a P-channel region, and N-ch an N-channel region. If the bulk is made of an N-type substrate, each P-channel MOS transistor is fabricated in the N-type substrate, while each N-channel MOS transistor is fabricated in a P-well formed inside the N-type substrate. Conversely, if the bulk is made of a P-type substrate, each N-channel MOS transistor is fabricated in the P-type substrate, while each P-channel MOS transistor is fabricated in an N-well formed inside the P-type substrate. The same also applies to the MOS transistors comprising the FF cells.

Figure 7A:
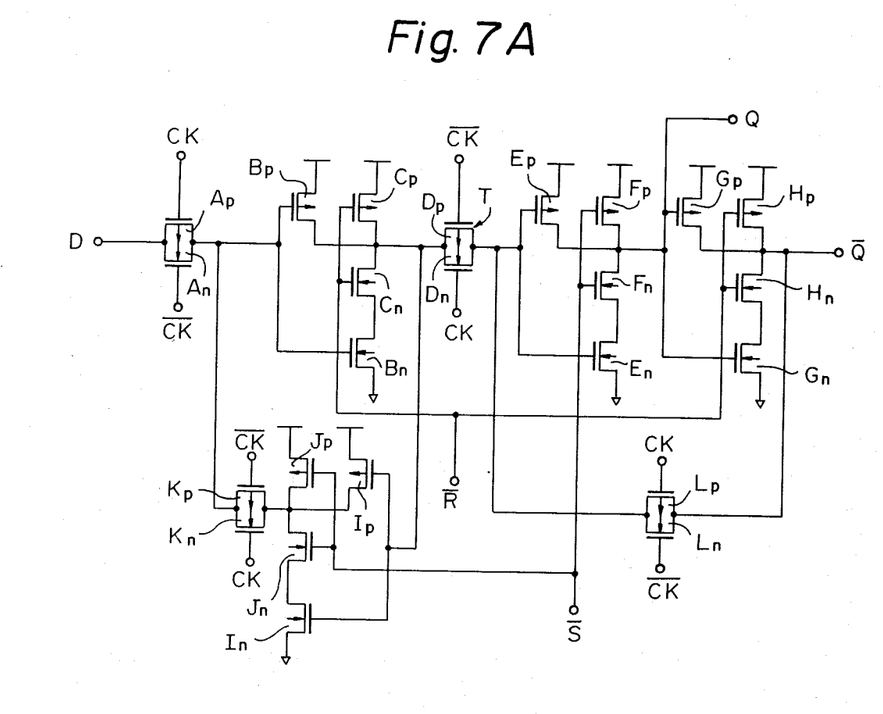
FIG. 7A is a circuit diagram of a known example of the FF circuit.
Figure 7B:
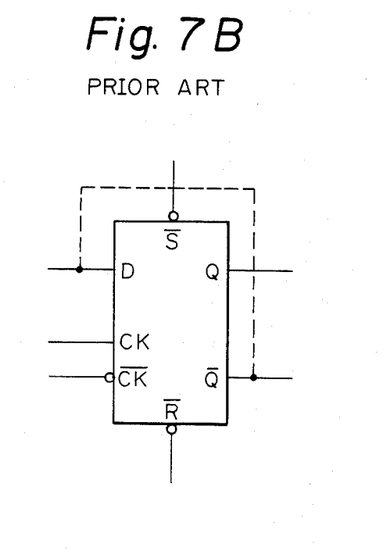
FIG. 7B depicts schematic indications of the FF circuit shown in FIG. 7A.

As mentioned earlier, the FF cell arrays introduced partially into the one-chip device together with the basic cell arrays can compensate for the areas occupied by unused first through fifth diffused resistor regions. FIG. 7A is a diagram of a known example of a FF circuit. Each of the FF cells in the lands 32 contains the FF circuit diagrammed as in FIG. 7A. FIG. 7B depicts schematic indications of the FF circuit shown in FIG. 7A. Each flip-flop is preferably designed, as previously mentioned, as a D flip-flop having set and reset function terminals. If, for example, the set function is not needed, an "H" (high) level signal is fixedly given to a set function terminal $\overline{S}$. If the reset function is not needed, an "H" level signal is fixedly given to a reset function terminal $\overline{R}$. If both are not required, the "H" level signal is given to each terminal. Further, if the $\overline{Q}$ output is fed back to the D input, a counter is created. In FIG. 7A, each MOS transistor identified by an outward pointing arrow denotes a P-channel MOS transistor, while each MOS transistor identified by an inward pointing arrow denotes an N-channel MOS transistor. Further, the reference symbol T denotes a transfer gate which is turned on or off by clocks CK and $\overline{CK}$. A detailed explanation of the operation of the FF circuit in FIG. 7A is omitted, since the FF circuit itself is widely known.

Figure 8:
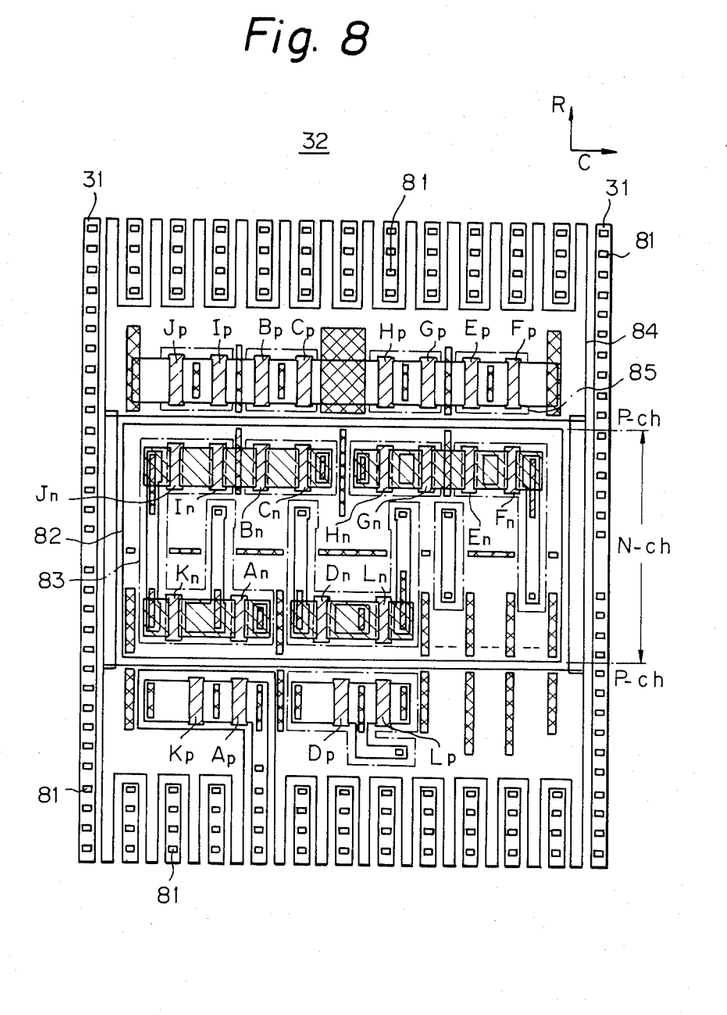
FIG. 8 illustrates an example of an actual layout pattern employed for realizing the FF circuit of FIG. 7A.
Figure 9A:
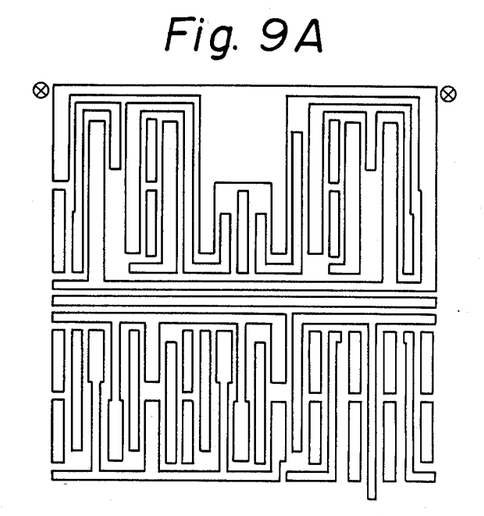
FIGS. 9A through 9D illustrate actual wiring layout patterns of metal conductors to be superposed onto the circuit pattern of FIG. 8 to produce a variety of flip-flops.
Figure 9B:
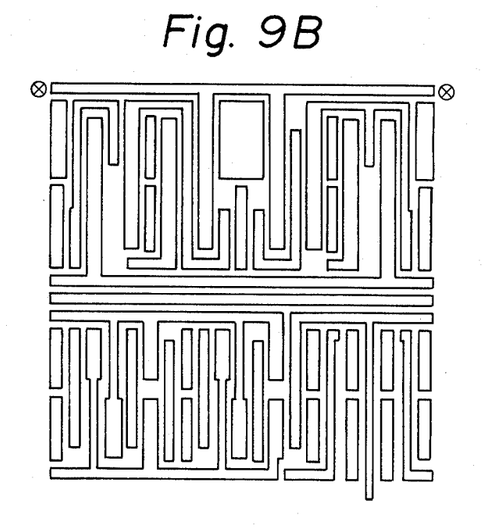
Figure 9C:
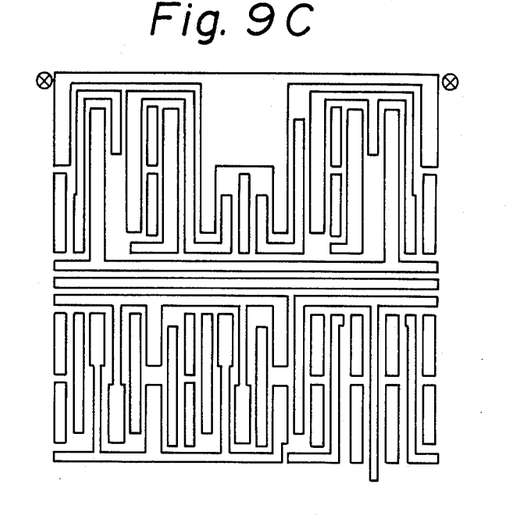
Figure 9D:
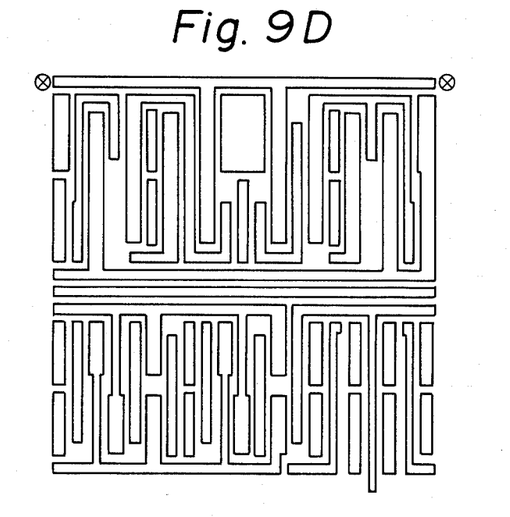
Figure 10A:
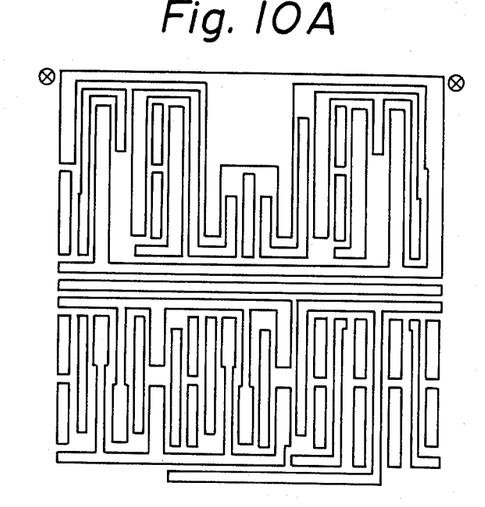
FIGS. 10A through 10D illustrate actual wiring layout patterns of metal conductors to be superposed onto the circuit pattern of FIG. 8 to produce a variety of counters.
Figure 10B:
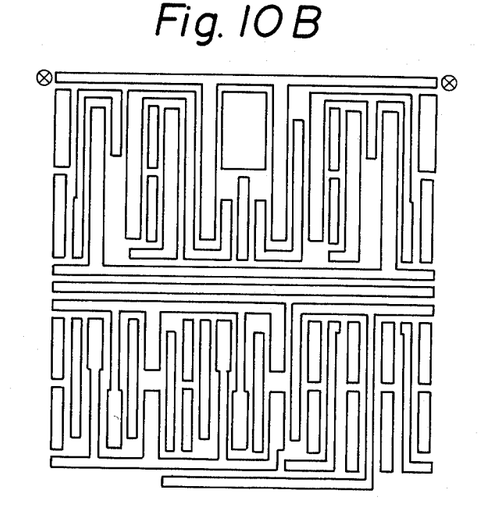
Figure 10C:
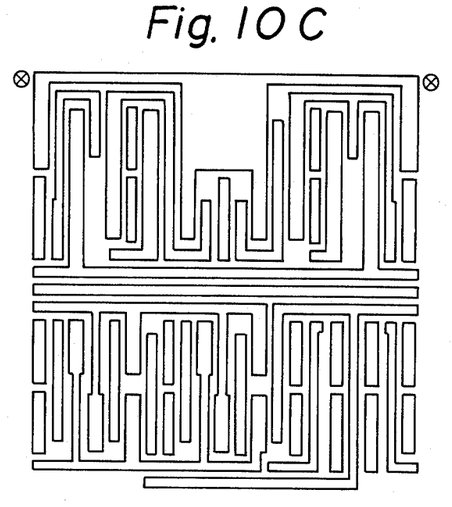
Figure 10D:
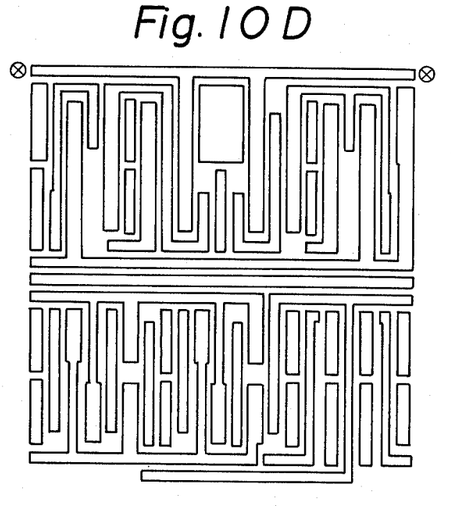

FIG. 8 is an example of an actual layout pattern employed for realizing the FF circuit of FIG. 7A. Illustration of the metal wirings is omitted here for brevity, but is provided in FIGS. 9A through 9D, FIGS. 10A through 10D, and FIG. 11. In FIG. 8, reference characters Ap through Lp correspond to portions where the P-channel MOS transistors Ap through Lp in FIG. 7A are positioned on the chip, respectively. Similarly, reference characters An through Ln correspond to portions where the N-channel MOS transistors An through Ln are positioned. The portions schematically distinguished by hatchings from the top right to bottom left denote so-called gate insulation layers, hatchings from the top left to bottom right denote so-called source and drain diffused regions for N-channel MOS transistors, and double hatchings denote contact windows. Rectangular regions located close to the gate insulation layers are the so-called source and drain regions for the P-channel MOS transistors. Reference numeral 81 indicates the positions at which the contact windows, referenced by numeral 25 in the former figures, are to be formed with the underlying diffused resistor regions, regardless of whether the contact windows are used or not. Reference numerals 82 and 83 represent the outer border and inner border of a channel cut region, respectively, enclosing the N-channel region N-ch. Similarly, 84 and 85 represent the outer border and inner border of another channel cut region, respectively, enclosing the P-channel regions P-ch. A branched $V_{SS}$ power line conductor is laid vertically at the center of the FF cell.

FIGS. 9A through 9D illustrate actual wiring layout patterns of metal conductors to be superposed onto the circuit pattern of FIG. 8 to produce a variety of flip-flops. In each of these figures, symbols ⓧ indicate positions at which patterns of these figures must be aligned, in a direction perpendicular to the surfaces of drawings, with positions ⓧ shown at the top right and left in FIG. 8. The same also applies to later figures. The wiring patterns of FIGS. 9A through 9D are used, respectively, for fabricating a D flip-flop, SR (set/reset) flip-flop, S (set) flip-flop, and R (reset) flip-flop.

FIGS. 10A through 10D illustrate actual wiring layout patterns of metal conductors to be superposed onto the circuit pattern of FIG. 8 to produce a variety of counters. The counter is generally expressed by the schematic indication of the FF circuit shown in FIG. 7B having additionally a feedback loop from the $\overline{Q}$ output to the D input, as indicated by broken lines. The wiring patterns of FIGS. 10A through 10D are used, respectively, for fabricating a counter, SR (set/reset) counter, S (set) counter, and R (reset) counter.

Figure 11:
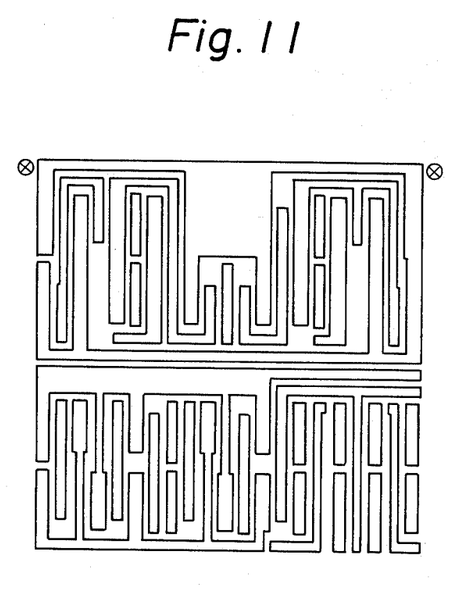
FIG. 11 illustrates an actual wiring layout pattern of metal conductors to be superposed onto the circuit pattern of FIG. 8 to make the FF cell invalid.

FIG. 11 illustrates an actual wiring layout pattern of metal conductors to be superposed onto the circuit pattern of FIG. 8 to make the FF cell invalid. If no FF circuit is needed, the basic FF cell of FIG. 8 is left as it is. In this case, conductors must be distributed thereon, because the FF cell is composed of MOS transistors through which undesired current would flow therein if no treatment, as in FIG. 11, is effected thereto.

Referring to the diffused resistor regions again, the diffused resistor regions are formed as P-type diffused regions in the N-type substrate or the N-well. Also, the diffused regions are formed as N-type diffused regions in the P-type substrate or the P-well. Such diffused resistor regions would seemingly not be appropriate for the wiring means due to their inherent resistance. However, in actuality, the resistance can be disregarded, since the MOS transistors have high input impedances. Accordingly, the MOS transistors are driven not under a current driving mode, but a voltage driving mode.

It may be considered to connect two or more diffused resistor regions in parallel so as to reduce the resistance, however, in actuality, this is not possible since such parallel-connected diffused register regions would increase in parasitic capacitance and, therefore, reduce the operation speed.

While the above description has been made in reference to a metal gate type master slice IC, it will be apparent to persons skilled in the art that the invention also applies to polysilicon gate type master slice IC's. Advance formation of FF circuits in the bulk enables a higher degree of integration than in conventional case.

As explained above in detail, the present invention realizes a master slice semiconductor device with high integration due to introduction of special FF cell arrays among the usual basic cell arrays in a bulk having many strip-like diffused resistor region buried therein.

We claim:

1. A master slice semiconductor substrate comprising:
   a semiconductor substrate;
   a plurality of basic cell arrays, each extending in the column direction, each of the basic cell arrays being formed in said semiconductor substrate and the basic cell arrrays being arranged in a row direction with a predetermined pitch, each basic cell array being comprised of a plurality of lands, with each land extending in the column direction, the lands being arranged in the column direction wiht a predetermined pitch, each land being comprised of a plurality of basic cells, and each basic cell being made of fundamental circuit elements;
   a flip-flop cell array extending in the column direction, said basic cell arrays being located on both sides of the flip-flop cell array, said flip-flop cell array having a predetermined pitch at the sides to said basic cell arrays, the flip-flop cell array being formed in said semiconductor substrate, the flip-flop cell array being comprised of a plurality of lands which extend in the column direction with a predetermined pitch, and each land being comprised of a plurality of flip-flop cells;
   a plurality of strip-like first diffused resistor regions, which are formed between the basic cell arrays and between the flip-flop cell array and the basic cell array, each first diffused resister region extending in the row direction and the first diffused resistor regions being arranged in the column direction;
   a plurality of strip-like second diffused resistor regions, which are formed between the basic cell arrays and extending in the row direction, both ends of which extend into portions between lands of adjacent basic cell arrays;
   a plurality of strip-like third diffused resistor regions, extending in the row direction and being formed between the lands of the flip-flop cell array, and both ends of each third diffused resistor region being located between the lands of the adjacent basic cell arrays;
   an insulating layer formed on said semiconductor substrate; and
   metal wirings formed on the insulating layer being distributed between the basic cell arrays and between the flip-flop cell array and the basic cell array, which wirings extend at least in the column direction for an interconnection.

2. A master slice semiconductor device according to claim 1 wherein said semiconductor substrate is an N-type bulk of said master slice semiconductor device;
   said insulating layer is formed on the surface of said bulk;
   said basic cells are composed of P-channel MOS transistors fundamental circuit elements and N-channel MOS transistors fundamental circuit elements, said P-channel MOS transistors and said N-channel MOS transistors being formed in an N-type substrate and in a P-type well formed in said N-type substrate respectively;
   said flip-flop cells are composed of P-channel MOS transistor fundamental circuit elements and N-channel MOS transistor fundamental circuit elements, said P-channel MOS transistors and said N-channel MOS transistors being formed in an N-type substrate and in a P-type well formed in said N-type substrate respectively, each of said flip-flop cells being fabricated as a D flip-flop having reset and set function terminals
   wherein a required circuit function being produced by means of interconnecting at least said basic cells and said flip-flop cells using said metal wirings and said diffused resistor regions.

3. A master slice semiconductor device according to claim 1 wherein
   said semiconductor substrate is a P-type bulk of said master slice semiconductor device;
   said insulating layer is formed on the surface of said bulk;
   said basic cells are composed of P-channel MOS transistor fundamental circuit elements and N-channel MOS transistor fundamental circuit elements, said P-channel MOS transistors and said N-channel MOS transistors being formed in a p-type substrate and in an N-type well formed in said p-type substrate respectively;
   said flip-flop cells are composed of P-channel MOS transistor fundamental circuit elements and N-channel MOS transistor fundamental circuit elements, said P-channel MOS transistors and said N-channel MOS transistors being formed in a p-type substrate and in an N-type well formed in said p-type substrate respectively, each of said flip-flop cells being fabricated as a D flip-flop having reset and set function terminals
   wherein a required circuit function being produced by means of interconnecting at least said basic cells and said flip-flop cells using said metal wirings and said diffused resistor regions.

4. A device as set forth in claim 1 wherein said diffused resistor regions are provided with contact windows formed in said insulation layer directly above said regions and interconnections between each two adjacent regions are performed with said wirings
   wherein any two of said first, second, and third diffused resistor regions are connected with each other by way of contact windows.

5. A device as set forth in claim 1, wherein input/output ports inherent to each said basic cell land are mainly concentrated along its sides extending in parallel with said column direction, while input/output terminals inherent to each said flip-flop cell land are mainly concentrated along its sides extending in parallel with said row direction.

6. A device as set forth in claim 1, wherein each of said flip-flop cells fabricated as a D flip-flop having reset and set function terminals produce a counter function, with suitable metal conductor arrangements.

7. A device as set forth in claim 1, wherein each of said flip-flop cells fabricated as a D flip-flop having reset and set function terminals produce an UP/DOWN counter function, with suitable metal conductor arrangements.

8. A device as set forth in claim 1, wherein each of said flip-flop cells fabricated as a D flip-flop having reset and set function terminals produce a shift register function, with suitable metal conductor arrangements.

9. A device as set forth in claim 1, wherein each of said flip-flop cells fabricated as a D flip-flop having reset and set function terminals produce a Johnson counter function, with suitable metal conductor arrangements.

10. A device as set forth in claim 1, wherein each of said flip-flop cells fabricated as a D flip-flop having reset and set function terminals produce a universal shift register function, with suitable metal conductor arrangements.

* * * * *

UNITED STATES PATENT AND TRADEMARK OFFICE
CERTIFICATE OF CORRECTION

PATENT NO. : 4,750,027
DATED : June 7, 1988
INVENTOR(S) : Fumitaka ASAMI et al

It is certified that error appears in the above-identified patent and that said Letters Patent is hereby corrected as shown below:

On the cover page, Item [75], after "Japan" insert

--Osamu Takagi, Tokyo, Japan--.

Signed and Sealed this

Third Day of January, 1989

*Attest:*

DONALD J. QUIGG

*Attesting Officer*      *Commissioner of Patents and Trademarks*